United States Patent
Douskey et al.

(10) Patent No.: US 6,711,706 B2
(45) Date of Patent: Mar. 23, 2004

(54) METHOD AND APPARATUS FOR ELASTIC SHORTS TESTING, A HARDWARE-ASSISTED WIRE TEST MECHANISM

(75) Inventors: Steven Michael Douskey, Rochester, MN (US); Frank David Ferraiolo, Essex Junction, VT (US); Michael Stephen Floyd, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 622 days.

(21) Appl. No.: 09/746,610

(22) Filed: Dec. 20, 2000

(65) Prior Publication Data

US 2002/0078402 A1 Jun. 20, 2002

(51) Int. Cl.⁷ .............................................. G01R 31/28
(52) U.S. Cl. ...................... 714/724; 714/30; 714/733; 714/734
(58) Field of Search ................ 714/724, 726, 714/733, 734, 30, 720

(56) References Cited

U.S. PATENT DOCUMENTS

| | | | |
|---|---|---|---|
| 5,636,229 A | * | 6/1997 | Eerenstein et al. |
| 6,070,252 A | * | 5/2000 | Xu et al. .................... 714/30 |
| 6,249,893 B1 | * | 6/2001 | Rajsuman et al. .......... 714/741 |
| 6,260,163 B1 | * | 7/2001 | Lacroix et al. ............. 714/726 |

* cited by examiner

Primary Examiner—Phung M. Chung
(74) Attorney, Agent, or Firm—Duke W. Yee; Casimer K. Salys; Christopher P. O'Hagan

(57) ABSTRACT

A method, program and system for electrical shorts testing are provided. The invention comprises setting any chips to be tested to drive 0's on their drive interfaces, and setting all receive interfaces on the chips to receive 0's and log any failures. Next a single receive interface is selected for testing. A hardware shift register is associated with each drive side interface, wherein each bit of the register is connected to an off-chip driver on the interface. This hardware shift register for the selected interface is then set to all 0's, and the first bit of the shift register is loaded to a 1. The invention then performs a pause count. After this count, the 1 is shifted to the next bit in the register and another pause count is performed. This process is repeated until the 1 is walked completely through the register and all pins on the interface have been tested. The walking 1 test is then repeated for any additional interfaces that require testing. Any nets not controlled by the new Electrical Shorts Test (EST) should ideally be set to drive 1 during this walking 1 test. In addition, an inverted shorts test can be performed in which the 1 and 0 values are reversed and a walking 0 test is performed through the register, thus allowing the interfaces to be tested at both polarities. Nets not controlled by the new EST should be driven to 0 during the Inverted test.

30 Claims, 5 Drawing Sheets

METHOD AND APPARATUS FOR ELASTIC SHORTS TESTING, A HARDWARE-ASSISTED WIRE TEST MECHANISM

BACKGROUND OF THE INVENTION

1. Technical Field

The present invention relates to interconnect testing in electrical systems. More specifically, the present invention relates to interconnect testing using a hardware-based approach.

2. Description of Related Art

Traditional interconnect testing, like that described in Joint Test Action Group (JTAG) Institute of Electrical and Electronics Engineers (IEEE) standard 1149.1, has a strong dependence on software interaction and scan functions. IBM has expanded this single card testing concept in the original JTAG specification to multiple card testing within a system (Wire Test). The traditional Wire Test method involves scanning test patterns into the boundary latches of all chips in a system interface, sampling at all chips' interfaces, and scanning the patterns out of each chip to compare the resulting patterns. This process is repeated so that every driver drives at least once in the system, with multiple patterns on each interface, to determine and diagnose problems such as shorts and opens on these interfaces, if they exist. In this manner, it can be determined if all interconnections between chips in a system are intact. Manufacturing and system assembly relies heavily on such patterns to test systems as they are built and to diagnose manufacturing problems.

The IBM eServer iSeries system, which in one model incorporates up to $16^4$ processor chips and their associated memory and I/O controller support chips, has an order of magnitude more nets and chips connected over multiple cards than previous systems. This system has grown beyond the capabilities of the traditional system-wide Wire Test. More specifically, the time required to complete a software-driven test on a large system is unreasonable, as is the amount of pattern storage required by the traditional Wire Test methods.

Therefore, in light of the limitations of software-driven interconnect testing, a more hardware-driven test controlled by software would be desirable.

SUMMARY OF THE INVENTION

The present invention provides a method, program and system for electrical shorts testing. The invention comprises setting any chips to be tested to drive 0's on their drive interfaces, and setting all receive interfaces on the chips to receive 0's and log any failures. Next a single receive interface is selected for testing. A hardware shift register is associated with each drive side interface, wherein each bit of the register is connected to an off-chip driver on the interface. This hardware shift register for the selected interface is then set to all 0's, and the first bit of the shift register is loaded to a 1. The invention then performs a pause count. After this count, the 1 is shifted to the next bit in the register and another pause count is performed. This process is repeated until the 1 is walked completely through the register and all pins on the interface have been tested. The walking 1 test is then repeated for any additional interfaces that require testing. Any nets not controlled by the new Electrical Shorts Test (EST) should ideally be set to drive 1 during this walking 1 test.

In addition, an inverted shorts test can be performed in which the 1 and 0 values are reversed and a walking 0 test is performed through the register, thus allowing the interfaces to be tested at both polarities. Nets not controlled by the new EST should be driven to 0 during the Inverted test.

Since the walking patterns are generated by the hardware at run-time, very little storage is required in the external service element that is controlling the running of these manufacturing tests—only the commands necessary to initialized the hardware, start the test on each interface and check for pass or fail of each interface. In addition, the EST runs very quickly, since the patterns are driven and checked across all bits on an entire interface after being set up and initiated by a small number of commands. The interface test itself (pattern generation and checking) occurs at a speed determined by bus clocks of the chips on the interface, not the speed of the JTAG test port and service element accessing that port. Therefore, the EST of the present invention is several orders of magnitude faster than traditional wiretest.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
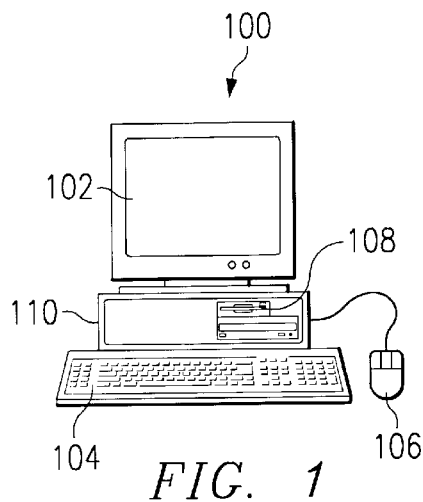
FIG. 1 depicts a pictorial representation of a data processing system in which the present invention may be implemented.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 110, a video display terminal 102, a keyboard 104, storage devices 108, which may include floppy drives and other types of permanent and removable storage media, and mouse 106. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
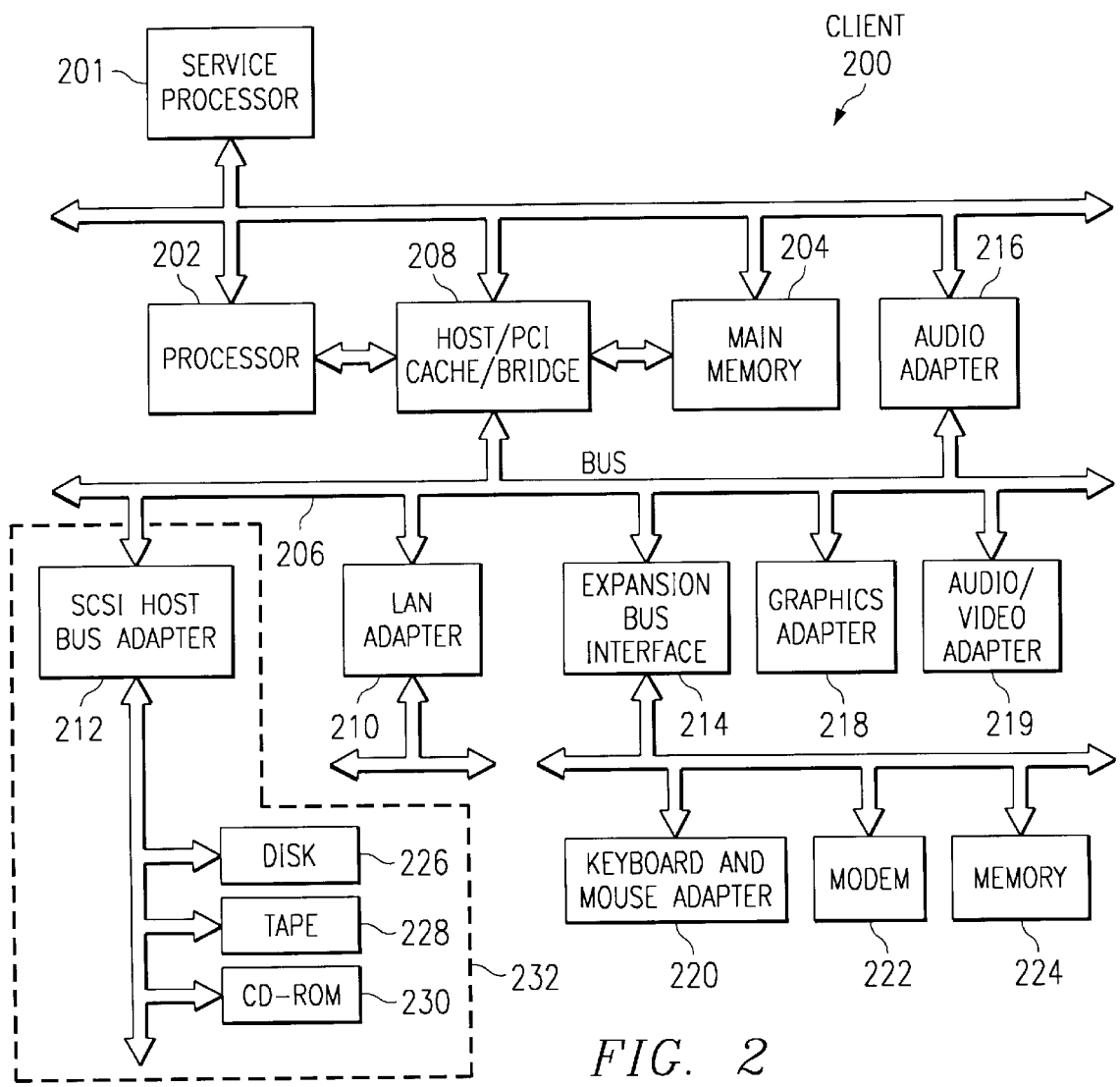
FIG. 2 depicts a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as AIX available from IBM. Instructions for the operating system and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by service processor (SP) 201 using computer implemented instructions, which may be located in a memory such as, for example, main memory 204, memory 224, or in one or more peripheral devices 226–230. SP 201 may be included in the system or attached in manufacturing or for special field testing. The service interface may be IEEE 1149.1 JTAG, I$^2$C, or any other interface style.

The present invention expands the capabilities of existing hardware to create a hardware-driven interconnect test controlled by software. The existing hardware multiplexing (mux) structure for Interface Alignment Procedure (IAP) on the Elastic Interfaces (EI's) are well suited for this task. The EI is a new high-speed interface style. The present invention is not limited to use as part of an EI design, but the nature of the EI lends itself well to be easily modified to accommodate inclusion of a full-blown Hardware-assisted Wire Test mechanism, known as the Electrical Shorts Test (EST). In non-EI designs, a similar muxing structure as that shown in FIG. 3 can be implemented to facilitate selecting the EST patterns necessary for the present invention onto the interface.

EI's dominate the IBM eServer iSeries I/O design. A composite test could be used, with a hardware-driven test for the EI's and traditional Wire Test for the remaining I/O, which make up only a fraction of the total nets.

The new test consists of three parts:

1. Stuck Driver Test (SDT): Traditional Wire Test for all non-EI nets to locate any stuck drivers or receivers within the nets (and some shorts with EI nets).

2. Short Net Test: Traditional Wire Test to all non-EI nets to locate any shorts within those nets.

3. Electrical Shorts Test (EST): New test to detect shorts within EI nets (and some shorts with other EI groups).

The first two steps are well known traditional Wire Test methods and were only modified in that the boundary scan chains were limited to contain only non-EI controlled boundary scan latches in order to reduce pattern size and test time to load and read patterns. Starting with the EI nets driving all 1's for the all 0 test, and driving all 0's for the all 1's test helps to detect shorts between these nets and the non-EI nets.

The new Electrical Shorts Test adds a hardware register and support mechanism to walk a 1 on the drive side down all receive side bits on all EI's, recording any failures. In this manner, every EI net differs from every other, twice allowing the detection of a short between any two or more nets. Additionally, this test can be repeated with the data inverted, which walks a 0 down the drive side. This allows the bits to be tested in both polarities.

The following definitions will help explain the terminology and commands used in the description the Figures:

ESTMODE: causes the drive side to select EST data to drive on its interface instead of normal functional data patterns.

REST (Receive EST): causes the receive side of the interface to expect the walking 1 pattern and not to fail when it detects a 1 on the first bit as the EST pattern commences.

CEST (Check EST): when set in the absence of REST, ensures that all bits of the interface are receiving 0's. If any bit on the interface is non-zero, a corresponding fail latch is set.

WEST (Write EST): causes the drive side to begin walking a 1 across each bit of the interface.

ESTONE: inverts the EST patterns such that the driving interface drives 1's and the receiving interface checks 1's, with a walking 0 pattern occurring across the interface during the WEST phase of the test, and CEST expects 1's on all interfaces.

RESTPASS: a summary latch maintained for each interface indicating if any bits of the interface have detected a defect on the interface for the duration of the EST procedure.

Figure 3:
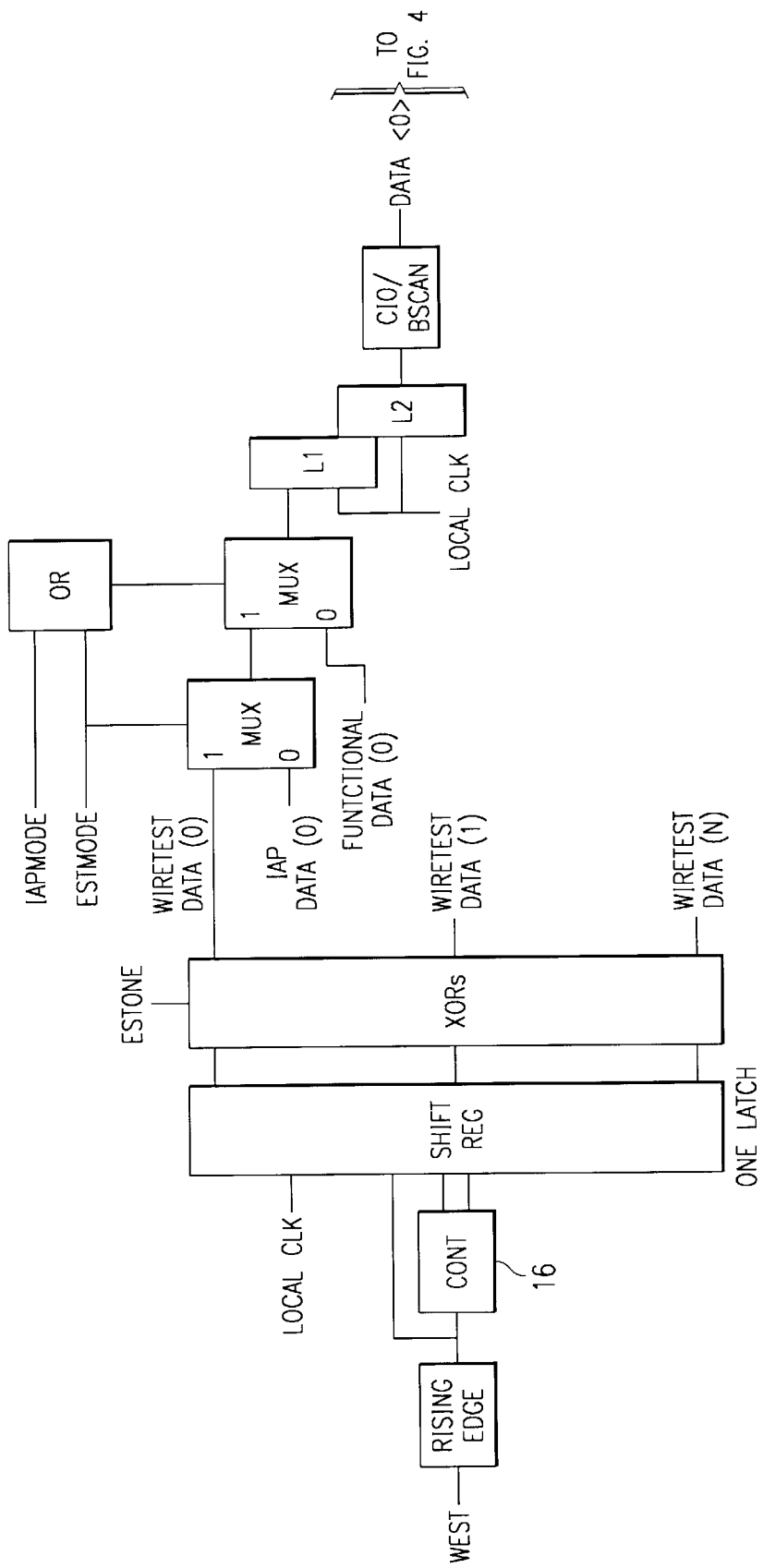
FIG. 3 depicts a diagram illustrating the transmit side of the Elastic Interface, with the addition of the Electrical Shorts Test (EST) function, in accordance with the present invention.

Referring to FIG. 3, a diagram illustrating the transmit side of the EI, with the addition of the EST function, is depicted in accordance with the present invention. A single bit is shown for simplicity. The drive path normally allows functional data to be driven off chip, but additional IAP or EST data may instead be selected through a series of 2 multiplexors (MUX). In the preferred embodiment, the EST data is generated by a shift register which starts at all 0's as a result of an initial scan flush. This register has a latch for each bit on the interface. This EST data, consisting of a walking 1 pattern, could alternately be generated via other means, such as by implementing a decode off of a counter.

The rising edge of the Write EST command (WEST) loads the first bit of the shift register to a 1 and starts a 16 state count. This count is a pause to allow the bit to travel across he interface without necessitating special timing requirements for the EST. When the count completes, the 1 shifts to the next bit in the register and remains in that that position for another 16 cycles. In this manner, a 1 is walked through the register, and thus across the interface. Upon completion of the EST, the final 1 in the shift register simply falls off the end, leaving the shift register and thus the interface driving all 0's. Note that, if the ESTONE signal is driven from an initial testoptions bit, active prior to Check EST (CEST), then the data driven to the interface will all be inverted. This allows a walking 0 test which is useful in diagnostics, discussed below.

Figure 4:
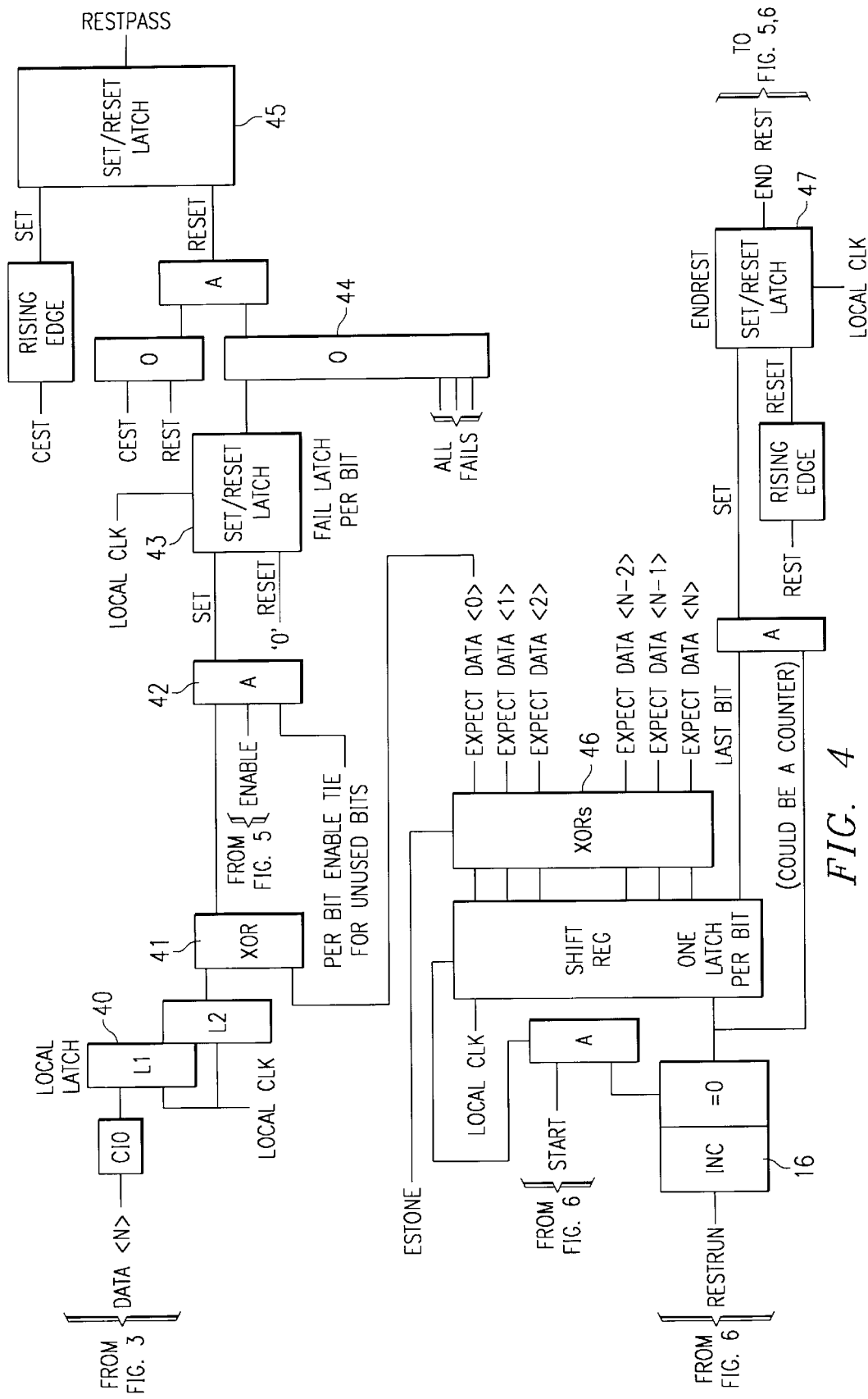
FIG. 4 depicts a diagram illustrating the receive logic for data comparison to support the EST in accordance with the present invention.

Referring to FIG. 4, a diagram illustrating the receive logic for data comparison to support the EST is depicted in accordance with the present invention. The local latch 40 captures the data from the interface into a latch on the local receive chip's clock domain. The Exclusive OR (XOR) 41 compares the input data with the expected data. The AND 42 masks the compare function when it is invalid or unwanted during diagnostics. The fail bit set/reset (S/R) latch 43 is scan-flushed initially to 0 and is set for any "unexpected" received signal, which occurs in the presence of a detected defect on the interface. All individual fail bits are OR'ed (O) 44 together and reset the RESTPASS latch 45 if any fail during the test. RESTPASS latch 45 is set at the beginning of EST and literally means all bits pass up to this point in the testing of the system interfaces. Activation of the ESTONE signal inverts the expect data for the comparison of the walking 0 test by activating XORs 46. Receipt of the Start signal, described in FIG. 6, introduces a single 1 into the first bit of the shift register. Every 16 cycles thereafter, the 1 advances through the bits of the shift register. The 1 eventually falls off the end of the shift register, setting the ENDREST latch 47. ENDREST resets RESTRUN, stopping the test, but prevents it from falsely restarting the test in the case of a subsequent defect (i.e. short) involving bit 0 on this interface. ENDREST is reset at the start of each Receive EST (REST) command.

Inc. 16 is a 16-bit Incrementor used to step the walking 1 or 0 through the shift register, introducing a pause between each step. This pause allows the hardware to ignore the transition of the walking 1 between each bit on the interface, by checking only the middle eight cycles of the 16-cycle-wide pulse of the walked 1. This mechanism to check the middle eight cycles is describe in more detail in reference to FIG. 5. In this manner, the time alignment between the drive and receive side is not critical, and EST is really a DC test.

The Local Clock (Local Clk) runs at the same rate on both sides of a selected EI in the system (each different EI may not run at the same rate as others). The sides may not be aligned, as the IAP will do that later, but the Inc. 16 as described above allows busses up to four cycles out of alignment to still work for EST.

Figure 5:
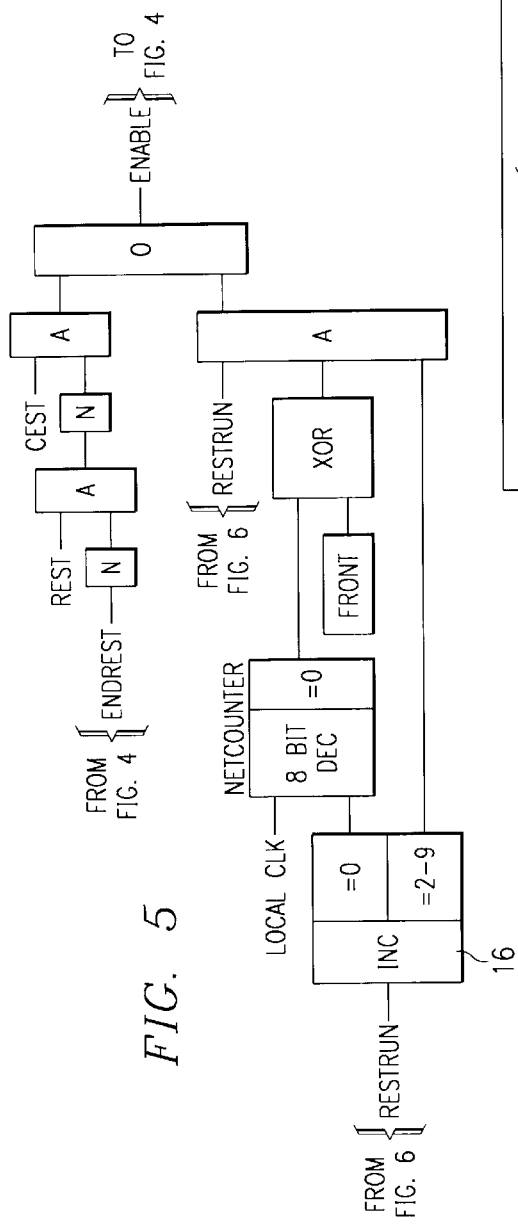
FIG. 5 depicts a diagram illustrating the creation of the Enable signal to support the EST in accordance with the present invention.

Referring to FIG. 5, a diagram illustrating the creation of the Enable signal to support the EST is depicted in accordance with the present invention. The Enable is first activated to all interfaces by turning on CEST. The Enable is deactivated when REST is selected for a particular interface until bit 0 is active for 4 cycles—turning on RESTRUN until EndREST indicates the walking 1 pattern is complete. RESTRUN remains active until EndREST is set at the end of the test. However, Enable is active only in windows where the 8-bit decrementor is 0 and the Inc. 16 is in the 2nd through 9th cycles, although different values can be chosen. The decrementor and Front latch are initially scan/flushed to 0's for a normal full test. For diagnostics, starting the decrementor at a value with Front at 0, driven from an initial testoptions bit, will enable checking of the selected back portion of the interface. If Front is set to 1, checking will start immediately and stop when the decrementor reaches 0. The boxes labeled N represent NOT (inverter).

Figure 6:
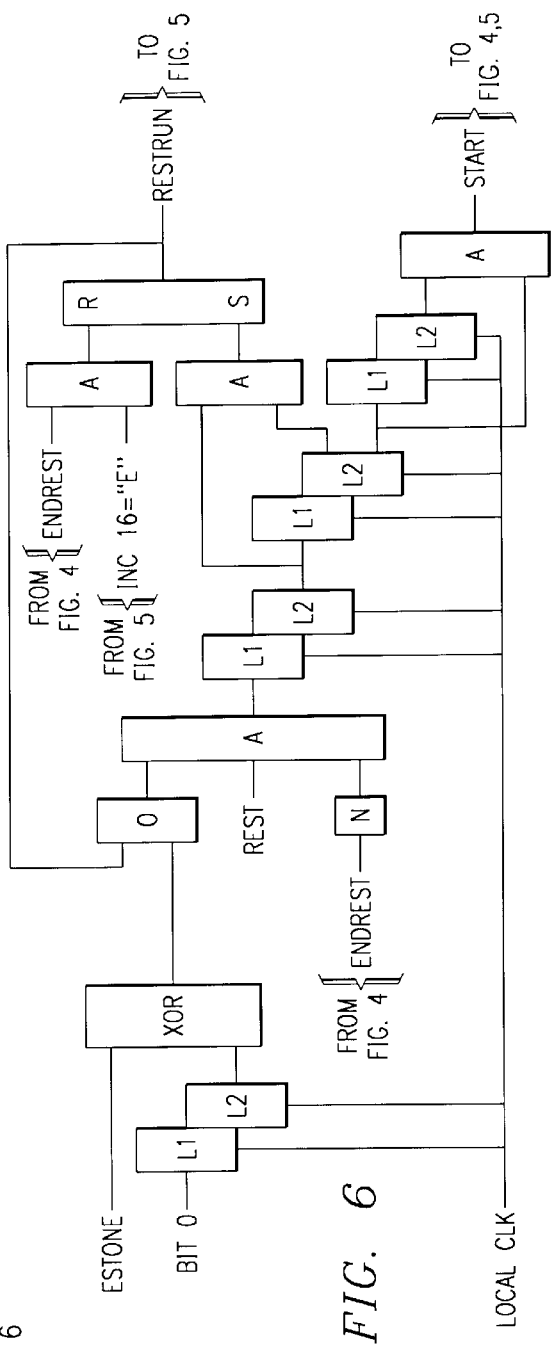
FIG. 6 depicts a diagram illustrating how bit 0 in REST triggers the Start signal for one cycle in accordance with the present invention.

Referring to FIG. 6, a diagram illustrating how bit (0) in REST triggers the Start signal for one cycle is depicted in accordance with the present invention. The XOR with ESTONE flips a walked 0 to a 1 for the start. The OR with the RESTRUN latch prevents any shorts to bit (0) from restarting the test during the walk, while the AND with NOT EndREST prevents a restart after the walk. The start signal is on for only one cycle at the start of REST, while RESTRUN remains active throughout the test. RESTRUN is reset when EndREST is set and the 16 state Incrementor is at "E". This in turn disables the Incrementor when it reaches 0.

The L1 and L2 boxes represent latches. They not only perform the start functions described above, but also align with the Inc. 16 to center the eight-cycle sample window for each iteration.

Figure 7:
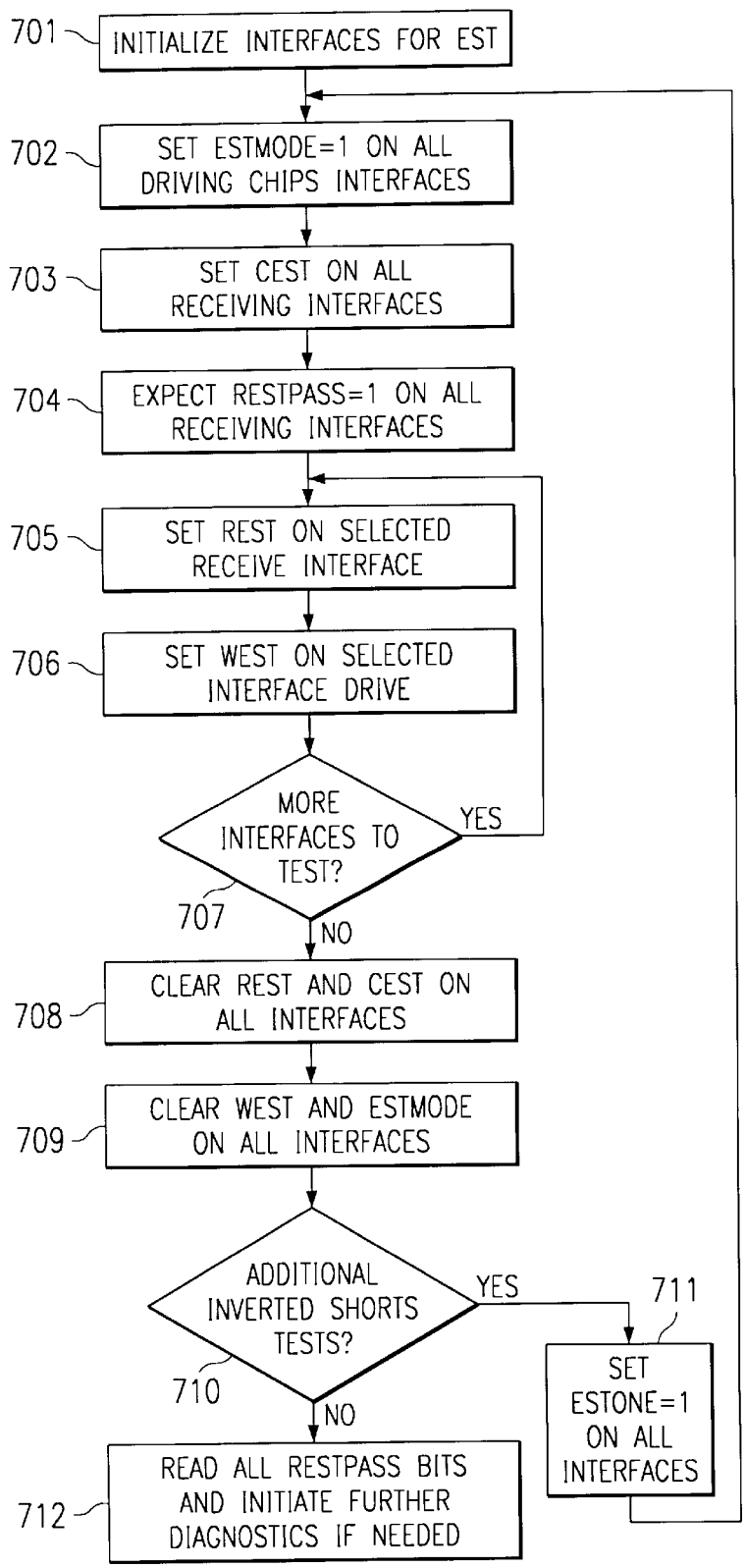
FIG. 7 depicts a flowchart illustrating the steps of the EST procedure in accordance with the present invention.

Referring now to FIG. 7, a flowchart illustrating the steps of the EST procedure is depicted in accordance with the present invention. The process begins by initializing chips interfaces for EST (step 701). The next step is to set ESTMODE=1 on all driving chips (step 702). This sets the global bit for the entire chip, and puts all chips in "drive all 0's" mode to drive 0's on their interfaces. Alternately, there may be an ESTMODE bit for each interface on a chip. The CEST is then set for all receive interfaces on all chips (step 703). This tells the receivers to receive 0's and log failures. All receiving interfaces are then checked for RESTPASS=1 (step 704). This separates "stuck at 1" and shorts to non-EI net failures from others detected later during EST.

REST is set on a selected receive interface which waits for bit (0) to trigger the test (step 705). WEST is then set on the driver for the selected receive interface (step 706). WEST kicks off the walking 1 test. It finishes in the "drive all 0's" state, and the receiver finishes in the "expect 0's" state. After the selected interface is tested, the invention determines if any other interfaces need testing (step 707). If other interfaces do need testing, the process returns back to step 705 and repeats until all interfaces have been tested.

If no interfaces remain to be tested, REST and CEST are cleared on all interfaces (step 708), thus turning off receiver checking for the interfaces. WEST and ESTMODE are then cleared for all interfaces (step 709). This turns off all driving interfaces and switches the ESTMODE to functional mode and quiesces the test logic.

The next step is to determine if additional inverted shorts tests are required (step 710). If an inverted test is required, the ESTONE is set to 1 on all interfaces, which enables the inverted version of EST (step 711). The process then returns to step 702.

If additional inverted shorts tests are not required, all RESTPASS bits are read and any desired diagnostics are initiated (step 712). If all RESTPASSes are still set, all are good. If any RESTPASS is not set, the clocks are turned off and the individual net data is retrieved. Further diagnostics are initiated and a System Reference Code (SRC) is logged that points to the failing net(s).

Two optional steps could be added to the flow in FIG. 7 as further options for diagnostics. The first option involves changing the receiver side to be able to start EST with bit (1) changing. This allows better diagnostics of the bit (0) failures, unless bit (0) and bit (1) are both broken. The other option is to have separate global failures during the interfaces' EST. This will help the later diagnostic sequence.

Though the present invention has been described in relation to interfaces between metal wires, it can also be used in wireless interfaces, such as radio frequency or lightwave.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMS, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for electrical shorts testing, comprising:
   selecting a single interface, from multiple chip interfaces, to be tested;
   using drive and receive hardware shift registers to drive and check a pattern across all bits on the interface at run-time;
   logging miscompares on any individual receiver; and
   summarizing individual failures into a global failure bit for the chip.

2. The method according to claim 1, wherein the step of driving and checking a pattern across the interface further comprises a walking 1 test.

3. The method according to claim 1, wherein the step of driving and checking a pattern across the interface further comprises a walking 0 test.

4. The method according to claim 1, further comprising:
   determining if additional receive interfaces need to be tested; and
   driving and checking a pattern across any additional interfaces that need to be tested.

5. The method according to claim 1, further comprising:
   determining if an additional inverted shorts test is required; and
   if an inverted test is required, repeating the steps in claim 1 using an inverted pattern.

6. The method according to claim 1, further comprising:
   reading the status of all receive interfaces;
   for any interface that has logged a failure, retrieving the individual net data and logging a System Reference code that points to the net; and
   initiating further diagnostics.

7. The method according to claim 1, wherein separate global failures are used for each interface shorts test.

8. The method according to claim 1, wherein the shift register uses a latch for each bit on the interface.

9. The method according to claim 1, wherein the shift register uses a counter for each bit on the interface.

10. The method according to claim 1, wherein the receiving interface is masked to allow the hardware to log failures only during a selected portion of the walk test.

11. The method according to claim 1, wherein the interface is wireless.

12. A computer program product in a computer readable medium for use in a data processing system, for electrical shorts testing, comprising:
   instructions for selecting a single interface, from multiple chip interfaces, to be tested;
   instructions for setting up a pattern to be driven and checked across all bits in the interface by hardware shift registers;
   instructions for continuing the pattern shift to completion; and
   instructions for reading failure information for diagnostics.

13. The computer program product according to claim 12, wherein the instructions for setting up a pattern to be driven and checked across the interface further comprises instructions for setting up a walking 1 test.

14. The computer program product according to claim 12, wherein the instructions for setting up a pattern to be driven and checked across the interface further comprises instructions for setting up a walking 0 test.

15. The computer program product according to claim 12, further comprising:

instructions for determining if additional receive interfaces need to be tested; and instructions for setting up a pattern to be driven and checked across any additional interfaces that need to be tested.

16. The computer program product according to claim 12, further comprising:

instructions for determining if an additional inverted shorts test is required; and if an inverted test is required, instructions for repeating the steps in claim 12 using an inverted pattern.

17. The computer program product according to claim 12, further comprising:

instructions for reading the status of all receive interfaces;

for any interface that has logged a failure, instructions for retrieving the individual net data and logging a System Reference code that points to the net; and instructions for initiating further diagnostics.

18. The computer program product according to claim 12, wherein separate global failures are used for each interface shorts test.

19. The computer program product according to claim 12, wherein the interface is wireless.

20. A system for electrical shorts testing, comprising:

means for selecting a single interface, from multiple chip interfaces, to be tested;

means for using drive and receive hardware shift registers to drive and check a pattern across all bits on the interface at run-time;

means for logging miscompares on any individual receiver; and means for summarizing individual failures into a global failure bit for the chip.

21. The system according to claim 20, wherein the means for driving and checking a pattern across the interface further comprise means for performing a walking 1 test.

22. The system according to claim 20, wherein the means for driving and checking a pattern across the interface further comprises means for performing a walking 0 test.

23. The system according to claim 20, further comprising:

means for determining if additional receive interfaces need to be tested; and means for driving and checking a pattern across any additional interfaces that need to be tested.

24. The system according to claim 20, further comprising:

means for determining if an additional inverted shorts test is required; and if an inverted test is required, means for repeating the steps in claim 20 using an inverted pattern.

25. The system according to claim 20, further comprising:

means for reading the status of all receive interfaces;

for any interface that has logged a failure, means for retrieving the individual net data and logging a System Reference code that points to the net; and means for initiating further diagnostics.

26. The system according to claim 20, wherein separate global failures are used for each interface shorts test.

27. The system according to claim 20, wherein the shift register uses a latch for each bit on the interface.

28. The system according to claim 20, wherein the shift register uses a counter for each bit on the interface.

29. The system according to claim 20, wherein the receiving interface is masked to allow the hardware to log failures only during a selected portion of the walk test.

30. The system according to claim 20, wherein the interface is wireless.

* * * * *